(12) United States Patent
De Sandre et al.

(10) Patent No.: US 8,054,698 B2
(45) Date of Patent: Nov. 8, 2011

(54) DEVICE FOR PROGRAMMING A PCM CELL WITH DISCHARGE OF CAPACITANCE AND METHOD FOR PROGRAMMING A PCM CELL

(75) Inventors: Guido De Sandre, Brugherio (IT); Luca Bettini, Bergamo (IT)

(73) Assignee: STMicroelectronics S.r.l., Agrate Brianza (IL)

( * ) Notice: Subject to any disclaimer, the term of this patent is extended or adjusted under 35 U.S.C. 154(b) by 339 days.

(21) Appl. No.: 12/510,661

(22) Filed: Jul. 28, 2009

(65) Prior Publication Data

US 2010/0020594 A1   Jan. 28, 2010

(30) Foreign Application Priority Data

Jul. 28, 2008   (IT) .............................. TO2008A0581

(51) Int. Cl.
*G11C 5/14* (2006.01)
(52) U.S. Cl. .............................. 365/189.16; 365/189.09
(58) Field of Classification Search ............. 365/189.16, 365/189.09, 185.18
See application file for complete search history.

(56) References Cited

U.S. PATENT DOCUMENTS

| | | | |
|---|---|---|---|
| 6,570,784 B2 | 5/2003 | Lowrey | |
| 6,657,420 B1 * | 12/2003 | Shacter | ........................ 323/288 |
| 7,075,841 B2 | 7/2006 | Resta et al. | |
| 7,336,110 B1 | 2/2008 | Payrard et al. | |
| 2003/0002331 A1 | 1/2003 | Park et al. | |
| 2005/0041498 A1 | 2/2005 | Resta et al. | |
| 2006/0007729 A1 | 1/2006 | Cho et al. | |
| 2008/0144353 A1 | 6/2008 | Lung | |

* cited by examiner

*Primary Examiner* — Vu Le
(74) *Attorney, Agent, or Firm* — Lisa K. Jorgenson; Robert Ianucci; Seed IP Law Group PLLC

(57) ABSTRACT

A device for programming PCM cells includes a pulse-generator circuit for supplying programming current pulses. The pulse-generator circuit includes: at least one first capacitive element; a charging circuit, connectable to the first capacitive element in a first operating condition, for bringing a reference voltage on the first capacitive element to a reset value; a discharge-current generator, selectively connectable to the first capacitive element in a second operating condition, for discharging the first capacitive element through a controlled discharge current; a logic unit, configured to control connection and disconnection of the first capacitive element), of the charging circuit, and of the discharge-current generator; and a voltage-to-current converter, for converting the reference voltage into current.

29 Claims, 10 Drawing Sheets

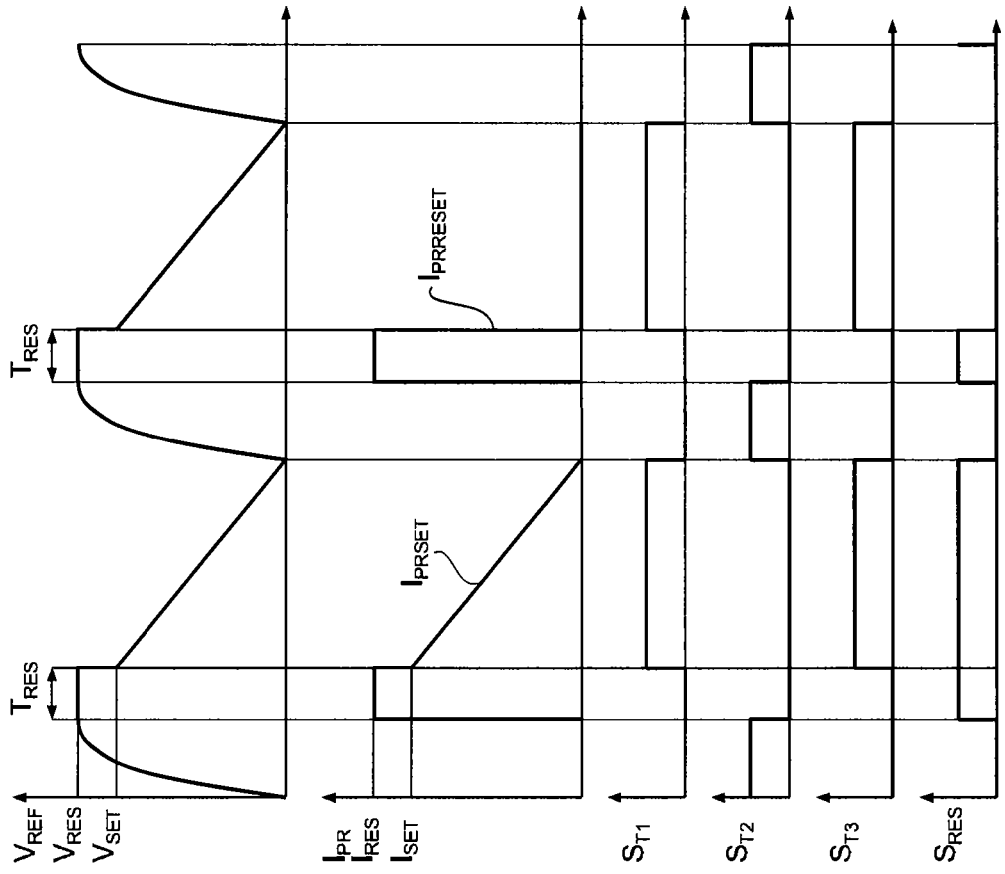
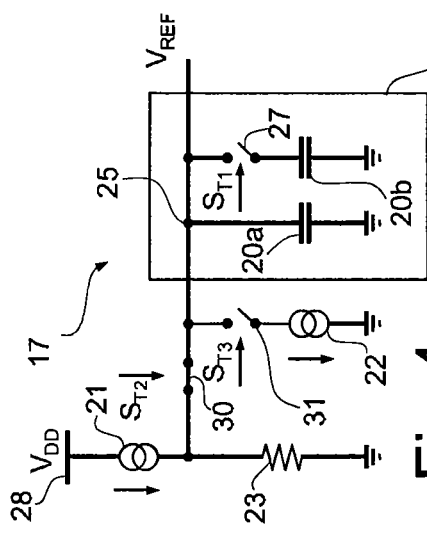
Fig.4
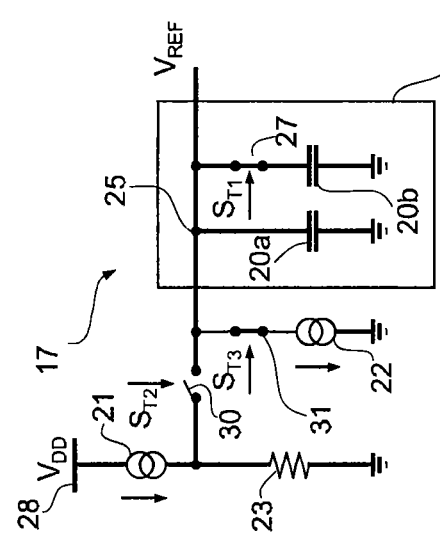
Fig.5

DEVICE FOR PROGRAMMING A PCM CELL WITH DISCHARGE OF CAPACITANCE AND METHOD FOR PROGRAMMING A PCM CELL

BACKGROUND

1. Technical Field

The present disclosure relates to a device for programming a phase-change memory (PCM) cell with discharge of capacitance and to a method for programming a PCM cell.

2. Description of the Related Art

As is known, phase-change memory (PCM) elements exploit the characteristics of materials that have the property of switching between two phases having distinct electrical characteristics. For example, these materials can switch between an amorphous, disorderly, phase and a crystalline or polycrystalline, orderly, phase, and the two phases are associated with resistivities of considerably different values. In addition, intermediate configurations, in which the material has only partially switched to the amorphous phase or to the crystalline phase, can be associated with intermediate values of resistivity.

Currently, the alloys of Group VI of the periodic table, such as Te or Se, referred to as chalcogenides or chalcogenic materials, can be advantageously used in phase-change cells. The currently most promising chalcogenide is formed by an alloy of Ge, Sb and Te (Ge2Sb2Te5, GST), widely used also for storing information in overwritable disks. In chalcogenides, the resistivity varies by two or more orders of magnitude when the material passes from the amorphous phase (more resistive) to the crystalline phase (less resistive) and vice versa.

The use of PCM elements for providing memory cells and arrays has been already proposed. In particular, in phase-change memories, a portion of chalcogenic material is used as programmable resistor, which can be electrically heated by a controlled current so as to switch between a high resistance condition and a low resistance condition and vice versa, respectively associated to which are a first logic value and a second logic value. The state of the chalcogenide can be read by applying a voltage sufficiently low as not to cause a sensible heating and by measuring the current that traverses it. Since the current is proportional to the conductance of the chalcogenic material, it is possible to distinguish the two states.

As has been mentioned, the phase transitions between the highly resistive amorphous state and the highly conductive crystalline state can be induced electrically through current pulses of appropriate amplitude and duration.

In particular, the transition towards the amorphous state ("reset") is obtained by applying current pulses of an amplitude sufficient to heat the chalcogenide beyond the melting point by Joule effect. The current pulses are generally rectangular, or in any case with steep edges so that cooling of the chalcogenide is so fast as to prevent crystallization.

The transition towards the crystalline state ("set") can be induced in different ways, and different techniques are currently used.

Irrespective of the technique adopted, a reset pulse is applied preliminarily for rendering completely amorphous an adequate volume of chalcogenide.

A first technique uses rectangular set current pulses. The amplitude of the set pulses is smaller than the amplitude of the reset pulses so that the temperature of the chalcogenide will exceed a phase-switching temperature, without, however, reaching the melting temperature. The duration of the pulses is, instead, sufficient to enable complete crystallization of the chalcogenide. The time required for programming is, however, excessively long, and the levels of performance of the memories are not acceptable.

A second technique, described in U.S. Pat. No. 6,570,784 exploits trapezoidal set pulses. The amplitude of the set pulse is initially close to the amplitude of the reset pulse, and then decreases according to a linear ramp for a time interval, after which the pulse is interrupted. Also the temperature of the chalcogenide decreases ("quenching") according to a linear ramp. The technique exploits the fact that the crystallization time is very short in a narrow range of temperatures around an optimal temperature. The initial amplitude and final amplitude of the set pulse can be easily calibrated in such a way that the temperature of the chalcogenide, during the quenching ramp, will vary around the optimal crystallization temperature. In the previous case, instead, the duration of the set pulses had to be in any case long enough to enable crystallization even with temperatures of the chalcogenide significantly different from the optimal temperature so as to take into account the process dispersions and the changeable operating conditions.

According to a further solution, a single pulse is supplied having a constant stretch and a decreasing-ramp stretch, instead of a reset pulse followed by a set pulse. The initial amplitude of the pulse is sufficient to bring the chalcogenide to the melting temperature. Once a time interval has elapsed such as to ensure complete amorphization, the amplitude of the pulse decreases according to a linear or discrete ramp. The time necessary for programming is further reduced, since a single pulse is used. However, the quenching time is in any case rather long, since the ramp starts from a temperature higher than the melting temperature. In addition, to produce the set pulse a waveform-forming circuit is used that is rather complex and cumbersome.

According to U.S. Pat. No. 7,075,841, the set pulse has a trailing edge of an exponential type. The proposed solution enables reduction of the time necessary for programming the individual memory cell, but requires two separate circuits for generating the set and reset pulses.

BRIEF SUMMARY

One embodiment provides a device for programming a PCM cell and a method for programming a PCM cell that are simple to implement and versatile.

One embodiment is a device for programming a PCM cell, including a pulse-generator circuit for supplying a programming current pulse and a logic unit. The pulse-generator circuit includes:

a first capacitive element;

a charging circuit selectively coupled to the first capacitive element in a first operating condition, for bringing a reference voltage on the first capacitive element to a reset value;

a discharge-current generator selectively coupled to the first capacitive element in a second operating condition, for discharging the first capacitive element by a controlled discharge current; and a voltage-to-current converter configured to convert the reference voltage into the programming current pulse.

The logic unit is configured to control connection and disconnection of the first capacitive element, with the charging circuit and the discharge-current generator.

BRIEF DESCRIPTION OF THE SEVERAL VIEWS OF THE DRAWINGS

For a better understanding, an embodiment of the present disclosure will now be described, purely by way of non-limiting example and with reference to the attached drawings, wherein:

FIG. 3 is a graph that shows quantities corresponding to the programming device of FIG. 2, operated according to a method in accordance with one embodiment;

FIG. 4 shows a detail of the programming device of FIG. 2 in a first operative configuration;

FIG. 5 shows the detail of FIG. 4 in a second operative configuration;

DETAILED DESCRIPTION

Figure 1:
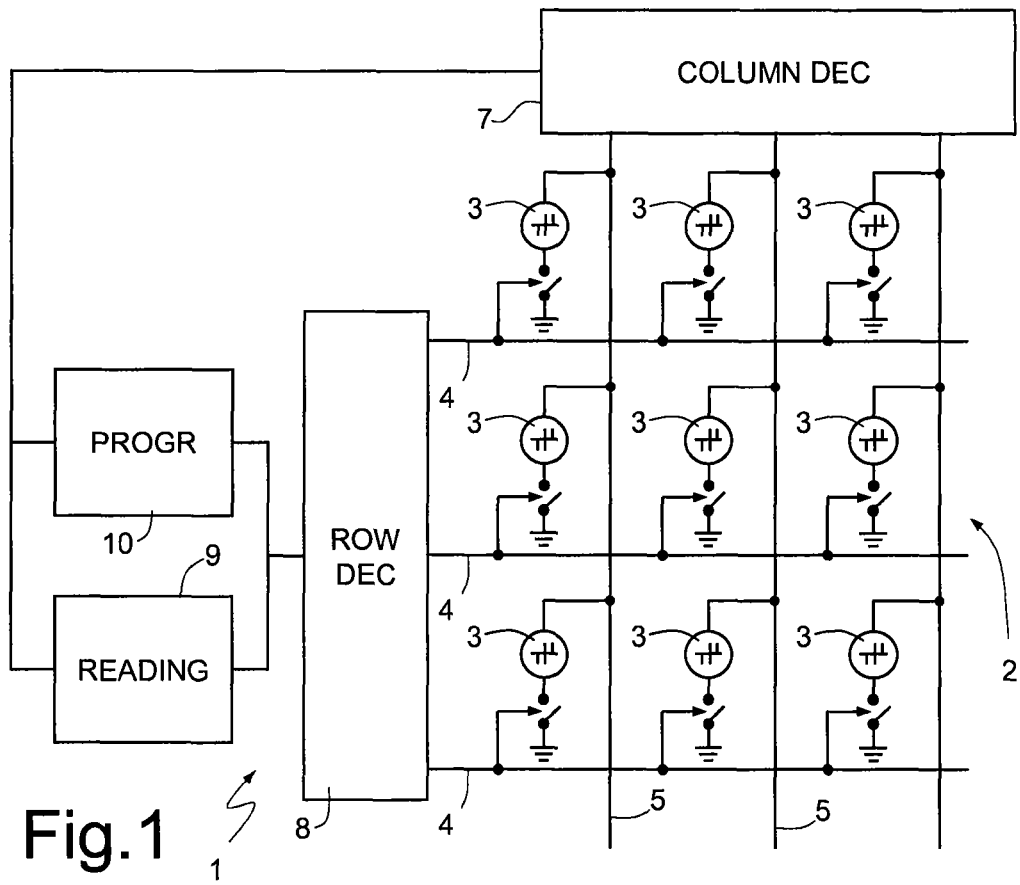
FIG. 1 is a block diagram of a phase-change memory.

With reference to FIG. 1, a phase-change memory (PCM) 1 comprises an array 2 of PCM cells 3, arranged in rows and columns and connected to respective wordlines 4 and bitlines 5, a column decoder 7, a row decoder 8, and a read device 9, and a programming device 10.

Figure 2:
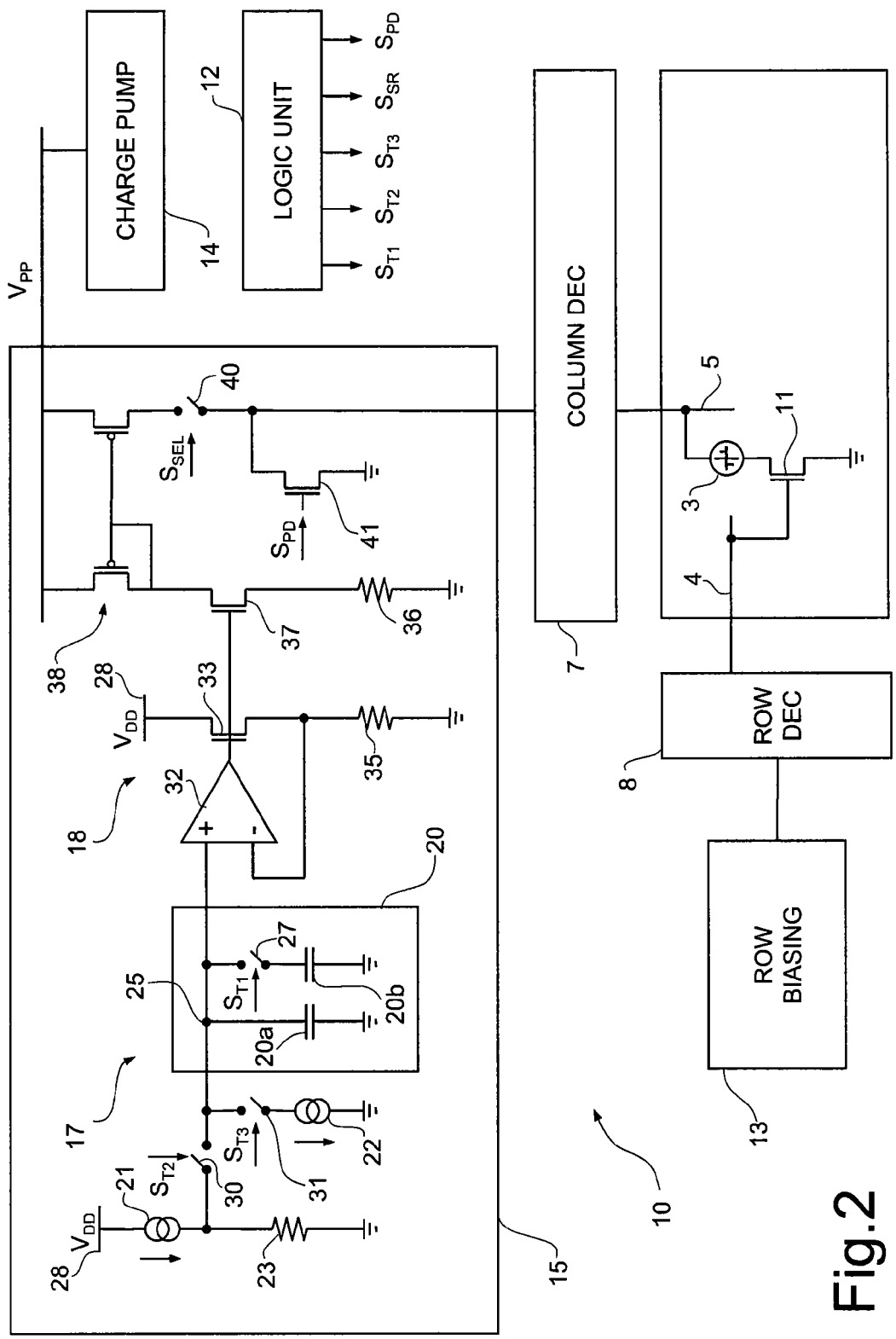
FIG. 2 is a simplified circuit diagram of a device for programming a phase-change memory incorporated in the memory of FIG. 1 and obtained in accordance with an embodiment of the present disclosure.

FIG. 2 illustrates in greater detail the programming device 10 and moreover shows a PCM cell 3, selected for programming and connected to the programming device 10 through a respective selector 11, the respective wordlines 4 and bitlines 5, the column decoder 7, and the row decoder 8.

The programming device 10 comprises a logic unit 12, a row-biasing stage 13, a charge pump 14 and a pulse-generator stage 15.

The row-biasing stage 13 is of a known type and will not be described in detail.

The logic unit 12 generates a plurality of control signals for the pulse-generator stage 15, as will be clarified more fully below.

The pulse-generator stage 15 comprises a reference generator circuit 17, which supplies a reference voltage $V_{REF}$, and a voltage-to-current converter 18, which produces programming current pulses $I_{PR}$ on the basis of the reference voltage $V_{REF}$.

In greater detail, the reference generator circuit 17 comprises a capacitive element 20, which includes a reference capacitor 20a and a charge-sharing capacitor 20b, a charge-current generator 21, a discharge-current generator 22, and a reference resistor 23.

The capacitive element 20 is connected between ground and a reference node 25, on which there is the reference voltage $V_{REF}$. In particular, the reference capacitor 20a is permanently connected to the reference node 25 and to ground, while the charge-sharing capacitor 20b can be selectively inserted in parallel to the reference capacitor 20a through a charge-sharing switch 27, controlled by the logic unit 12. For this purpose, the logic unit 12 generates a first timing signal $S_{T1}$.

The charge-current generator 21, which supplies a charge current $I_C$, and the reference resistor 23 are connected in series between a supply line 28, which supplies a supply voltage $V_{DD}$. In addition, an intermediate node between the charge-current generator 21 and the reference resistor 23 is selectively connectable to the reference node 25 through a charge switch 30, controlled by the logic unit 12 by means of a second timing signal $S_{T2}$.

The discharge-current generator 22 is selectively connectable to the reference node 25, in parallel with the reference capacitor 20a, through a discharge switch 31, for absorbing a discharge current $I_D$. The logic unit 12 uses a third timing signal $S_{T3}$ for controlling the discharge switch 31.

The voltage-to-current converter 18 comprises an operational amplifier 32, which forms a control loop with a loop transistor 33, a first conversion resistor 35 and a second conversion resistor 36, a tracking transistor 37 and a current mirror 38, driven by the operational amplifier 32.

In detail, the operational amplifier 32 has a first input connected to the reference node 25, while a second input and the output are respectively connected to the source terminal and to the gate terminal of the loop transistor 33, which is of an NMOS type. The drain terminal of the loop transistor 33 is connected to the supply line 28. The first conversion resistor 35 is connected between the second input of the operational amplifier 32 and ground and hence receives a voltage equal to the reference voltage $V_{REF}$.

The tracking transistor 37 is connected to the second conversion resistor 36 in source-tracking configuration and is driven, through its gate terminal, by the output of the operational amplifier 32. The first conversion resistor 35 and the second conversion resistor 36 are the same as one another, in the embodiment described here. Consequently, also on the second conversion resistor 36 there is the reference voltage $V_{REF}$.

The current mirror 38, of the type with PMOS transistors, is supplied by the charge pump 14, which provides a boosted voltage $V_{PP}$, higher than the supply voltage $V_{DD}$. An input branch of the current mirror 38 is connected to the drain terminal of the tracking transistor 37 for detecting a conversion current $I_{CV}$ that flows through the tracking transistor 37 itself and through the second conversion resistor 36. An output branch of the current mirror 38 is instead connected to the PCM cell 3 selected through the column decoder 7 and a set/reset selection switch 40. The logic unit 12 controls the set/reset selection switch 40 by a set/reset signal $S_{SR}$.

In addition, a pull-down transistor 41, controlled by the logic unit 12 by a pull-down signal $S_{PD}$, has conduction terminals respectively connected to ground and to the output of the current mirror 38.

The programming device 10 operates as described hereinafter, with reference also to FIGS. 3-5.

Initially, the reference capacitor 20a and the charge-sharing capacitor 20b of the capacitive element 20 are discharged.

Assigning to the timing signals $S_{T1}$ to $S_{T3}$ the values indicated in FIG. 3, the logic unit 12 closes the charge switch 30, while it opens the charge-sharing switch 27 and the discharge switch 31. The configuration shown in FIG. 4 is thus obtained, where the charge-current generator 21 starts to charge the reference capacitor 20a of the capacitive element 20. The configuration indicated is maintained until a stationary condition has been reached. In practice, designating by $R_C$ the resistance of the reference resistor 23 and by C the capacitance of the reference capacitor 20a, in this step a charge $Q = I_C R_C C$ is accumulated on the reference capacitor 20a and brings the reference voltage $V_{REF}$ to a reset value $V_{RES}$.

Through the control loop (formed by the operational amplifier 32 and by the loop transistor 33), the tracking transistor 37, and the current mirror 38, the voltage-to-current converter 18 converts the reference voltage $V_{REF}$ into the programming current $I_{PR}$ that is supplied to the selected PCM cell 3. In this step, the logic unit 12 maintains the set/reset selection switch 40 closed, irrespective of the value at which the PCM cell 3 is to be programmed (i.e., for both set and reset operations). In addition, the pull-down transistor 41 is inhibited.

In this step, the programming current has a reset value $I_{RES}$ sufficient to cause complete amorphization of the chalcogenide contained in the selected PCM cell 3 (reset).

Next, the charge switch 30 is opened. The reference voltage $V_{REF}$ remains at the reset value $V_{RES}$, and also the programming current $I_{PR}$ is constant at the reset value $I_{RES}$.

Once a pre-determined reset time interval $T_{RES}$ has elapsed, the reset step terminates, and the logic unit 12 opens the charge switch 30 and closes the charge-sharing switch 27 and the discharge switch 31 in a substantially simultaneous way (FIG. 5). The discharge switch 31 may be closed with a slight delay. When the charge-sharing switch 27 is opened, the charge initially accumulated on the reference capacitor 20a is shared with the charge-sharing capacitor 20b in a practically instantaneous way. The reference voltage $V_{REF}$ is then brought, with a negative step, to an initial set value $V_{SET}$, given by $$V_{SET} = Q/(C+C')$$

where C' is the capacitance of the charge-sharing capacitor 20b. In practice, the overall capacitance of the capacitive element 20 is increased. In response to the negative voltage step, also the programming current $I_{PR}$ presents a negative step and goes to an initial set value $I_{SET}$.

The discharge-current generator 22 then starts to discharge the capacitive element 20. In the embodiment described herein, the discharge current $I_D$ is constant and hence the discharge of the capacitive element 20 is linear. Consequently, also the reference voltage $V_{REF}$ and the programming current $I_{PR}$ decrease according to a linear ramp, enabling the chalcogenide of the PCM cell 3 to crystallize (set pulse $I_{PRSET}$ in FIG. 3). The duration of the set step can be easily controlled through the discharge current $I_D$.

In an alternative embodiment, the discharge current $I_D$ can be variable.

When the capacitive element 20 is completely discharged, the programming current $I_{PR}$ goes to zero, and the generation of a programming pulse terminates. At this point, the logic unit 12 restores the configuration of FIG. 4 so as to start a new programming cycle and generate a new pulse.

If the PCM cell 3 selected is to be set in the amorphous reset state, the logic unit 12 deactivates the current mirror 38 by opening the set/reset selection switch 40 at the moment when discharging of the capacitive element 20 starts, and then the current ceases to flow through the PCM cell 3 (reset pulse $I_{PRRESET}$ in FIG. 3). In addition, in order to guarantee an extremely short quenching time, the logic unit 12 switches on the pull-down transistor 41, which discharges almost instantaneously the bitline 5 connected to the PCM cell 3 selected and absorbs the residual currents during switching of the set/reset selection switch 40.

According to an alternative operating mode (FIG. 6), the discharge of the capacitive element 20 is delayed and interrupted before the programming current goes to zero. In practice, the step of charge of the reference capacitor 20a of the capacitive element 20 and the charge-sharing step are performed as already described previously. Closing of the discharge switch 31 is delayed by the logic unit 12 with respect to closing of the charge-sharing switch 27. In this way, the reference voltage $V_{REF}$ remains constant for a time interval at the initial set value $V_{SET}$, up until the logic unit 12 switches the third timing signal $S_{T3}$. In this way, the process of crystallization of the chalcogenide is favored.

Figure 7:
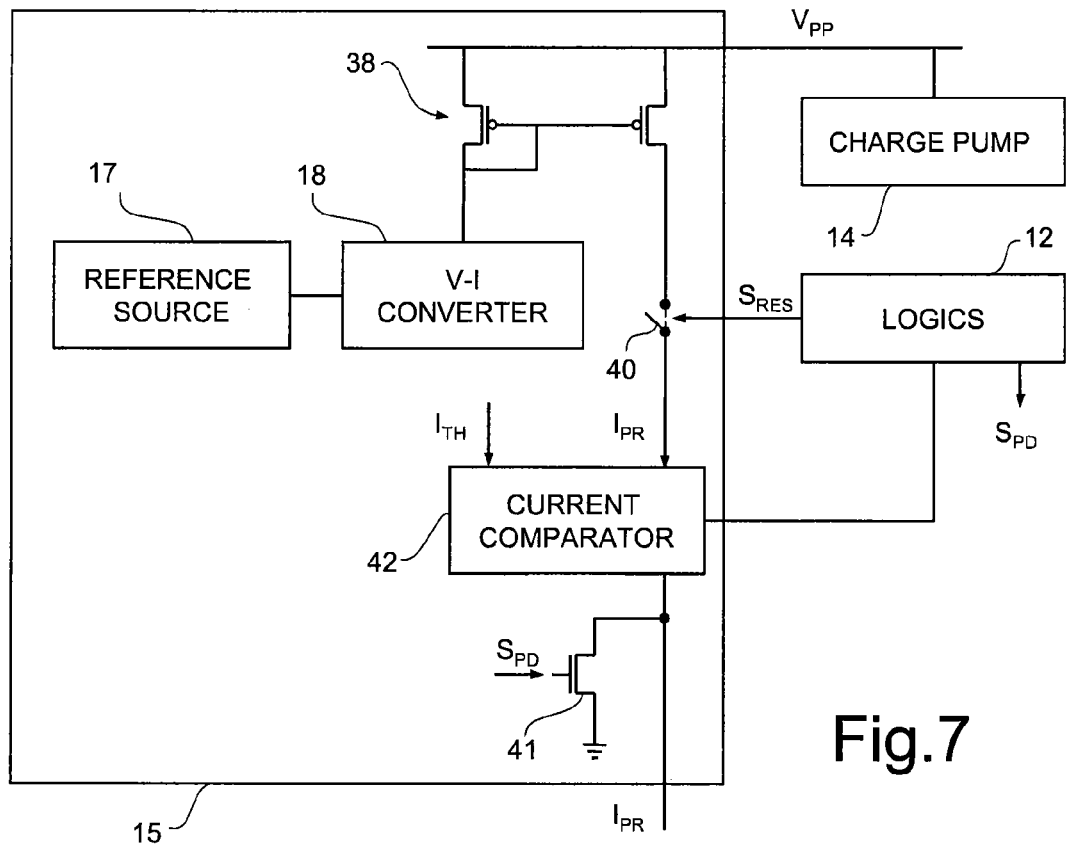
FIG. 7 shows another detail of the programming device of FIG. 2.

The programming pulse is moreover interrupted when the programming current $I_{PR}$ drops below a threshold $I_{TH}$. For this purpose, the pulse-generator stage 15 is provided with a current comparator 42, as shown in FIG. 7. When the programming current $I_{PR}$ drops below the threshold $I_{TH}$, the output of the current comparator 42, connected to the logic unit 12, switches. In response, the logic unit opens the set/reset selection switch 40 and activates the pull-down transistor 41. Instead of the current comparator 42, a voltage comparator (not shown) connected to the reference node 25 can be used, given the correlation between the reference voltage $V_{REF}$ and the programming current $I_{PR}$.

Alternatively, the discharge step can start simultaneously with the negative voltage step and be then interrupted before completion.

According to a further operating mode (FIG. 8), the charge-sharing step is not performed. In practice, a single capacitor is used, which is charged to the reference voltage $V_{REF}$ and, after a time interval, discharged by the discharge-current generator 22. The discharge ramp starts directly from the value of the reference voltage $V_{REF}$, without negative steps. In this case, just the reference capacitor 20a is sufficient, and hence the pulse-generator stage can be obtained in a particularly simple way, as is shown in FIG. 9, where it is designated by 15'.

Figure 10:
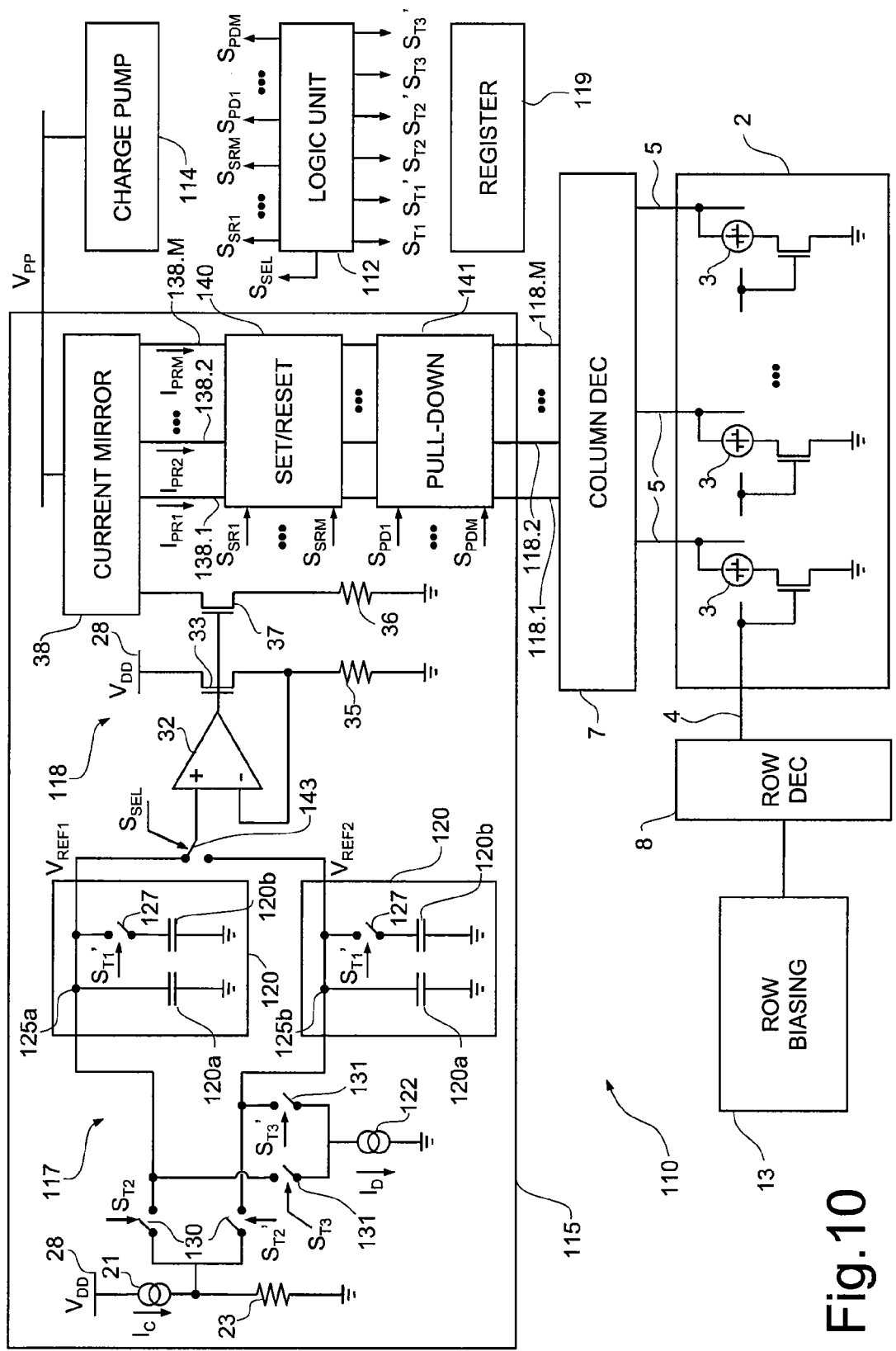
FIG. 10 is a simplified circuit diagram of a device for programming a phase-change memory provided in accordance with a further embodiment.

According to a different embodiment, the memory 1 comprises a programming device 110 of the type illustrated in FIG. 10, where parts that are the same as those already illustrated are designated by the same reference numbers.

In addition to the column decoder 7, the row decoder 8, the row-biasing circuit, and the charge pump 14, the programming device 110 comprises a logic unit 112, a pulse-generator stage 115, and a working-memory element, for example, a register 116.

The pulse-generator stage 115 comprises a reference generator circuit 117, which supplies the reference voltage $V_{REF}$, and a voltage-to-current converter 118, which produces programming current pulses $I_{PR}$ on the basis of the reference voltage $V_{REF}$.

In greater detail, the reference generator circuit 117 includes two capacitive elements 120, each having a respective reference capacitor 120a and a respective charge-sharing capacitor 120b, the charge-current generator 21, the discharge-current generator 22, and the reference resistor 23.

Figure 12:
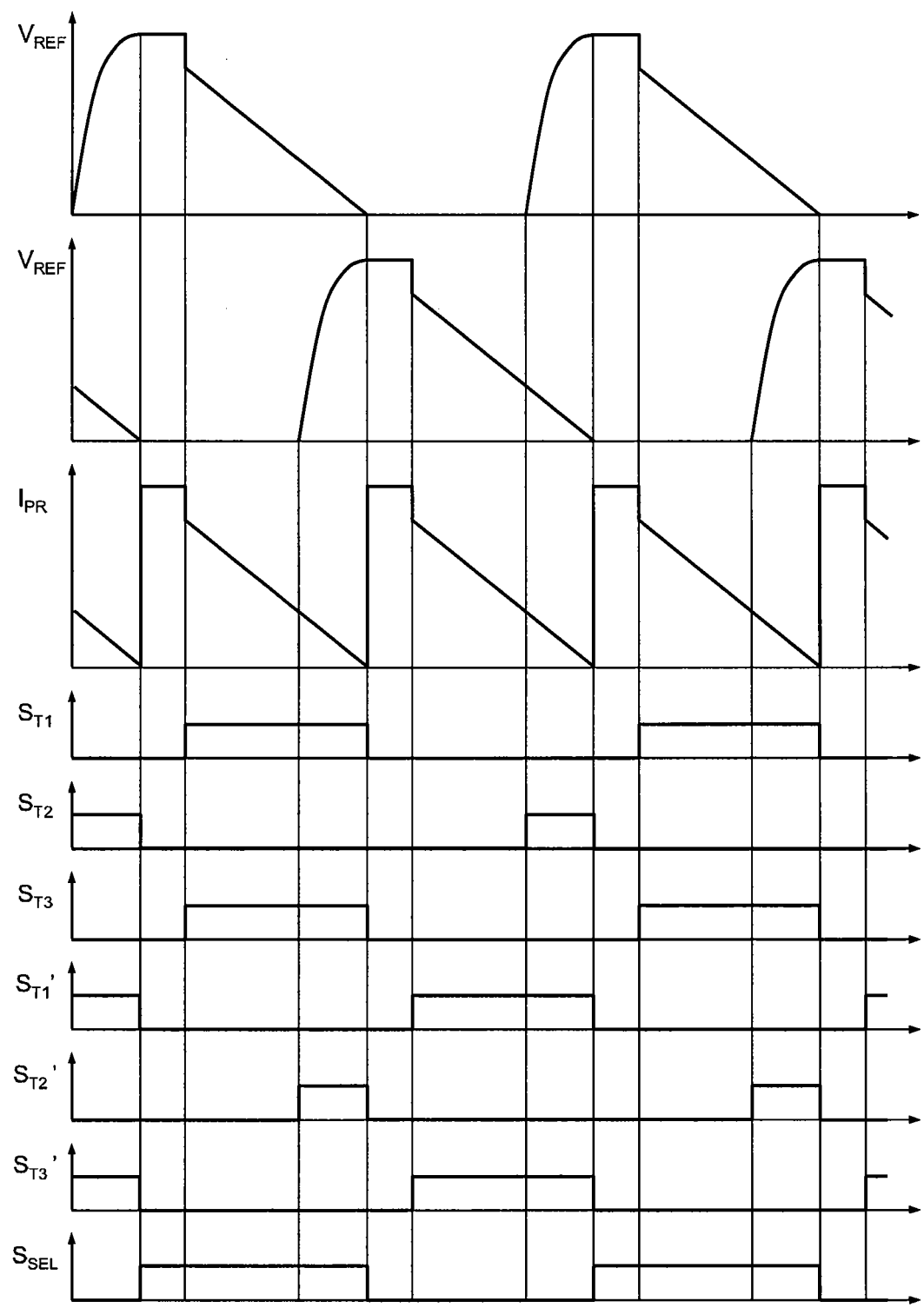
FIG. 12 is a graph that shows quantities corresponding to the programming device of FIG. 10, operated according to a method in accordance with a different embodiment.

The reference capacitors 120a of the two capacitive elements 120 are connected between ground and respective reference nodes 125a, 125b, on which there are a first reference voltage $V_{REF1}$ and a second reference voltage $V_{REF2}$, respectively. The charge-sharing capacitors 120b are connectable in parallel to the respective reference capacitors 120a through charge-sharing switches 127. The logic unit 112 controls the charge-sharing switches 127 of the two capacitive elements 20 through respective first timing signals $S_{T1}$, $S_{T1}'$ having the same waveform and delayed with respect to one another as explained hereinafter with reference to FIG. 12.

An intermediate node between the charge-current generator 21 and the reference resistor 23 can be alternatively connected to the reference nodes 125a, 125b through respective charge switches 130. The charge switches 130 are controlled by the logic unit 112 through respective second timing signals $S_{T2}$, $S_{T2}'$ having the same waveform and delayed with respect to one another.

The discharge-current generator 22 is alternately connectable to the reference nodes 125a, 125b in parallel to the reference capacitors 120a, through respective discharge switches 131, for absorbing a discharge current $I_D$. The logic unit 112 uses respective third timing signals $S_{T3}$, $S_{T3}'$, having the same waveform and delayed with respect one another, for controlling the discharge switches 131.

The voltage-to-current converter 118 has a plurality of outputs 118.1, 118.2, . . . , 118.M and comprises the operational amplifier 32, the loop transistor 33 the conversion resistors 35, 36, the tracking transistor 37, and a current mirror 138. The outputs 118.1, 118.2, . . . , 118.M, when activated, supply respective programming current pulses $I_{PR1}, I_{PR2}, \ldots, I_{PRM}$, each of which is correlated alternatively to the first reference voltage $V_{REF1}$ or to the second reference voltage $V_{REF2}$. In addition, a set/reset selection stage 140 and a pull-down stage 141 are arranged along lines that connect the outputs of the current mirror 138 to the column decoder 7.

The first input of the operational amplifier 32, which forms the input of the voltage-to-current converter 118, is alternatively connectable to one or the other of the capacitive elements 120 through a selector 143 controlled by the logic unit 112, which for this purpose generates a selection signal $S_{SEL}$.

Outputs 138.1, 138.2, . . . , 138.M of the current mirror 138 are connected to respective outputs 118.1, 118.2, . . . , 118.M of the voltage-to-current converter 118 and replicate the current that flows through the tracking transistor 37. In addition, the set/reset selection stage 140, actuated by the logic unit 112 by set/reset selection signals $S_{RES1}, S_{RES2}, \ldots, S_{RESM}$, at controlled instants deactivates the outputs 118.1, 118.2, . . . , 118.M of the voltage-to-current converter 118 that are respectively connected to selected PCM cells 3, but that do not require further programming operations. The pull-down stage 141 is activatable by the logic unit 112 through pull-down signals $S_{PD1}, S_{PD2}, \ldots, S_{PDM}$ for selective fast discharge, at the end of the reset step, of the PCM cells 3 selected that are to be set in the amorphous reset state.

Figure 11:
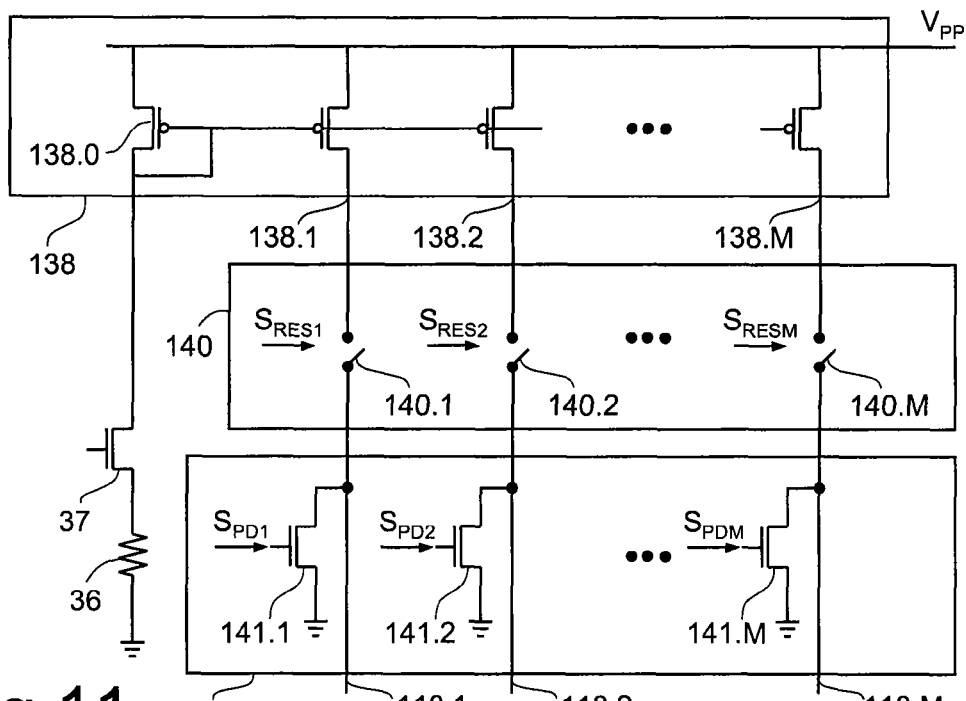
FIG. 11 is a more detailed circuit diagram of a detail of the programming device of FIG. 10.

The current mirror 138, the set/reset selection stage 140, and the pull-down stage 141 are illustrated in greater detail in FIG. 11.

The current mirror 138 comprises an input transistor 138.0, connected to the tracking transistor 37, and a plurality of output transistors, the drain terminals of which form the outputs 138.1, 138.2, . . . , 138.M.

The set/reset selection stage 140 comprises a plurality of set/reset selection switches 140.1, 140.2, . . . , 140.M, connected between respective outputs 138.1, 138.2, . . . , 138.M of the current mirror 138 and respective outputs 118.1, 118.2, . . . , 118.M of the voltage-to-current converter 118.

The pull-down stage 141 comprises a plurality of pull-down transistors 141.1, 141.2, . . . , 141.M, having conduction terminals connected to ground and to respective connection lines between outputs 138.1, 138.2, . . . , 138.M of the current mirror 138 and the column decoder 7. In addition, the gate terminals of the pull-down transistors 141.1, 141.2, . . . , 141.M receive respective pull-down signals $S_{PD1}, S_{PD2}, \ldots, S_{PDM}$.

The programming device 110 operates in the way described hereinafter. Initially, a set of PCM cells 3 are simultaneously selected, and the data to be programmed therein are stored temporarily in the register 16. Before carrying out programming operations, the PCM cells 3 selected are read, and their current contents are stored in the register 116 and compared with corresponding data to be programmed. Then, the selected PCM cells 3 are connected to respective outputs 118.1, 118.2, . . . , 118.M of the voltage-to-current converter 118. If the current contents of a PCM cell 3 coincide with the data to be programmed therein, the corresponding output 118.1, 118.2, . . . , 118.M is activated by the logic unit 112, which opens the respective set/reset selection switch 140.1, 140.2, . . . , 140.M.

Next, programming of the PCM cells 3 that require a phase change is started. As is shown also in FIG. 12, each of the two capacitive elements 120 is used alternately for generating a programming current pulse, as already described with reference to FIG. 3 (reset step, charge sharing, set step), while the other is recharged. Timing of the charge switches 130, of the charge-sharing switches 127 and of the discharge switches 131 associated to one and the other of the two capacitive elements 120 is delayed, and the selector 143 is controlled so as to alternately connect the first and second reference nodes 125a, 125b to the input of the voltage-to-current converter 118 for the time necessary for discharging the corresponding capacitive element 120. While the capacitive element 120 connected to the voltage-to-current converter 118 is discharged by the discharge-current generator 133, the other capacitive element 120 is charged by the charge-current generator 21. In this way, it is possible to eliminate the dead times for recharging of the capacitive elements 120, at the expense of a duplication of just two capacitors and certain switches. The programming speed is hence significantly improved.

In addition, the voltage-to-current converter with selectively activatable multiple outputs (obtained through the multiple-outputs current mirror 138 and the set/reset selection stage 140), enables simultaneous programming of PCM cells 3 in which distinct logic values are to be stored. In particular, all the selected PCM cells 3 are initially connected to respective outputs 138.1, 138.2, . . . , 138.M of the current mirror 138. The data to be programmed in the PCM cells 3 selected are stored in the register 119. Once a reset time interval has elapsed, the reset step terminates, and the logic unit 112 disconnects the cells that are to remain in the amorphous reset state from the current mirror 138 by opening the corresponding set/reset selection switches 140.1, 140.2, . . . , 140.M (the logic unit 112 moreover activates the corresponding pull-down transistors 141.1, 141.2, . . . , 141.M for discharging the bitlines 5 connected to the PCM cells programmed at the reset state and obtaining very short quenching times). Advantageously, opening of the set/reset selection switches 140.1, 140.2, . . . , 140.M causes switching-off of the corresponding outputs 138.1, 138.2, . . . , 138.M of the current mirror 138, thus reducing the power consumption.

Figure 13:
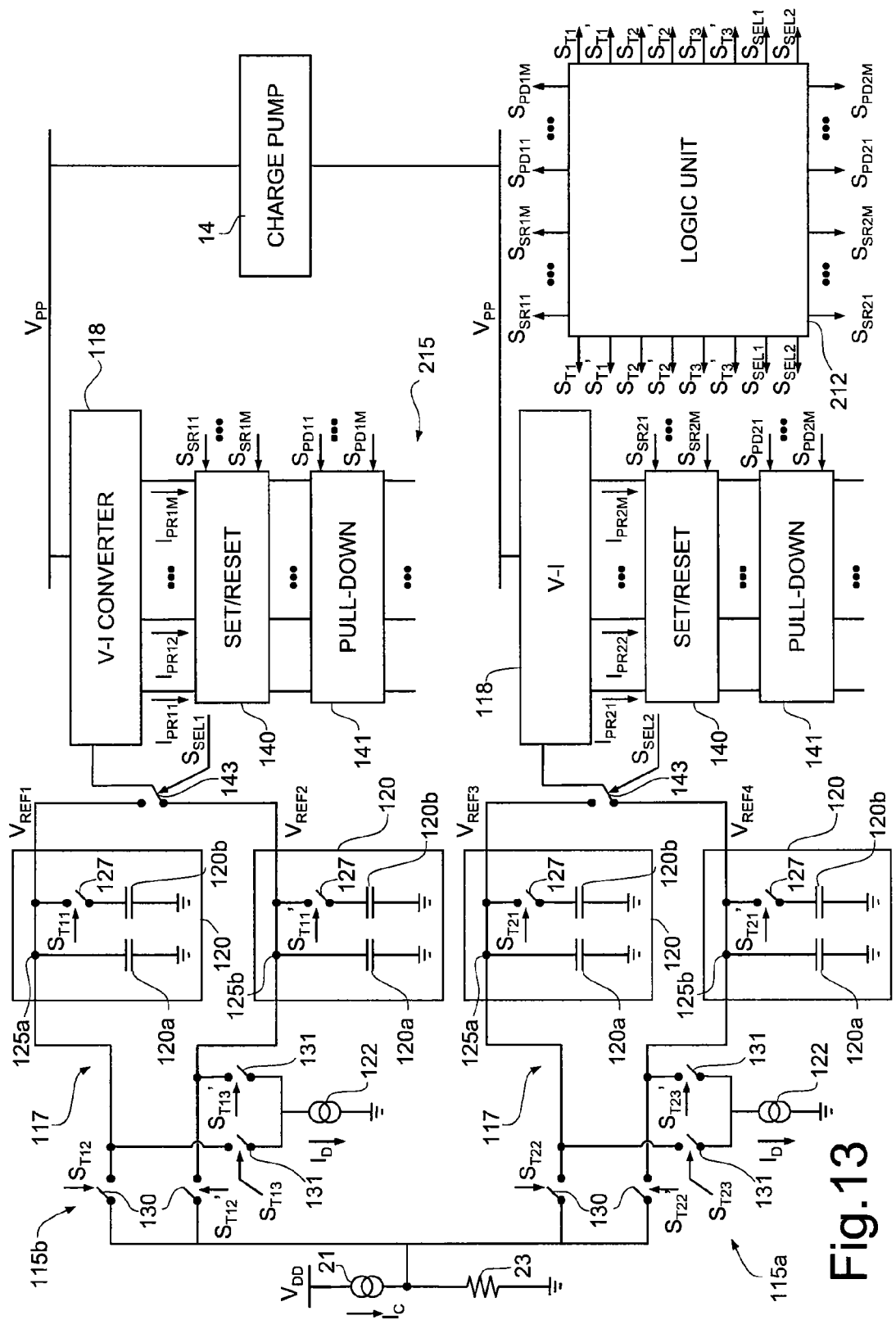
FIG. 13 is a simplified circuit diagram of a device for programming a phase-change memory provided in accordance with a further embodiment.

FIG. 13 illustrates a further embodiment of the invention. In this case, the memory 1 is provided with a programming circuit 210, which comprises a logic unit 212, the charge pump 14, a register 219, and a pulse-generator stage 215.

The pulse-generator stage 215 in practice includes two pulse-generator modules 115a, 115b, which are substantially identical to the pulse-generator stage 115 illustrated in FIG. 10, but have the charge-current generator 21 and the reference resistor 23 in common. The remaining part of the reference generator circuits 117 (i.e., the capacitive elements 120, the discharge-current generators 122, the charge-sharing switches 127, the charge switches 130 and the discharge switch 131), the voltage-to-current converters 118, the set/reset selection stages 140, and the pull-down stages 141 are, instead, distinct. In an alternative embodiment, the pulse-generator stage 215 includes two pulse-generator modules, each identical to the pulse-generator stage 115 of FIG. 10. Consequently, in this case, also the charge-current generator 21 and the reference resistor 23 are duplicated.

In particular, the charge switches 130 each have a terminal connected to the respective capacitive element 120 and a terminal connected to the charge-current generator 21 and are controlled through respective timing signals $S_{T12}$, $S_{T12}'$, $S_{T22}$, $S_{T22}'$, generated by the logic unit 212. Further timing signals $S_{T11}$, $S_{T11}'$, $S_{T21}$, $S_{T21}'$, $S_{T13}$, $S_{T13}'$, $S_{T23}$, $S_{T23}'$ are used by the logic unit 212 for controlling the charge-sharing switches 127 and the discharge switches 131 of the two pulse-generator modules 115a, 115b.

The voltage-to-current converters 118 have both multiple outputs, controlled by the logic unit 212 through the respective set/reset selection stage 140, which generates for the purpose set/reset selection signals $S_{SR11}$, $S_{SR12}$, ..., $S_{SR1M}$ (for the set/reset selection stage 140 of the pulse-generator module 115a) and set/reset selection signals $S_{SR21}$, $S_{SR22}$, ..., $S_{SR2M}$ (for the set/reset selection stage 140 of the pulse-generator module 115b).

The outputs of the pulse-generator module 115a and of the pulse-generator module 115b supply programming current pulses $I_{PR11}$, $I_{PR12}$, ..., $I_{PR1M}$ and programming current pulses $I_{PR21}$, $I_{PR22}$, ..., $I_{PR2M}$ for respective sets of PCM cells 3 selected for programming (not shown herein).

The outputs of the voltage-to-current converters 118 of the pulse-generator module 115a and of the pulse-generator module 115b supply programming current pulses $I_{PR11}$, $I_{PR12}$, ..., $I_{PR1M}$ and programming current pulses $I_{PR21}$, $I_{PR22}$, ..., $I_{PR2M}$ for respective sets of PCM cells 3 selected for programming (not shown herein). In greater detail, the programming current pulses $I_{PR11}$, $I_{PR12}$, ..., $I_{PR1M}$ are correlated alternatively to a first reference voltage $V_{REF2}$ and to a second reference voltage $V_{REF2}'$, respectively present on the reference nodes 125a, 125b of the pulse-generator module 115a; the programming current pulses $I_{PR21}$, $I_{PR22}$, ..., $I_{PR2M}$ are correlated alternatively to a third reference voltage $V_{REF2}$ and to a fourth reference voltage $V_{REF2}'$, respectively present on the reference nodes 125a, 125b of the pulse-generator module 115b.

Figure 14:
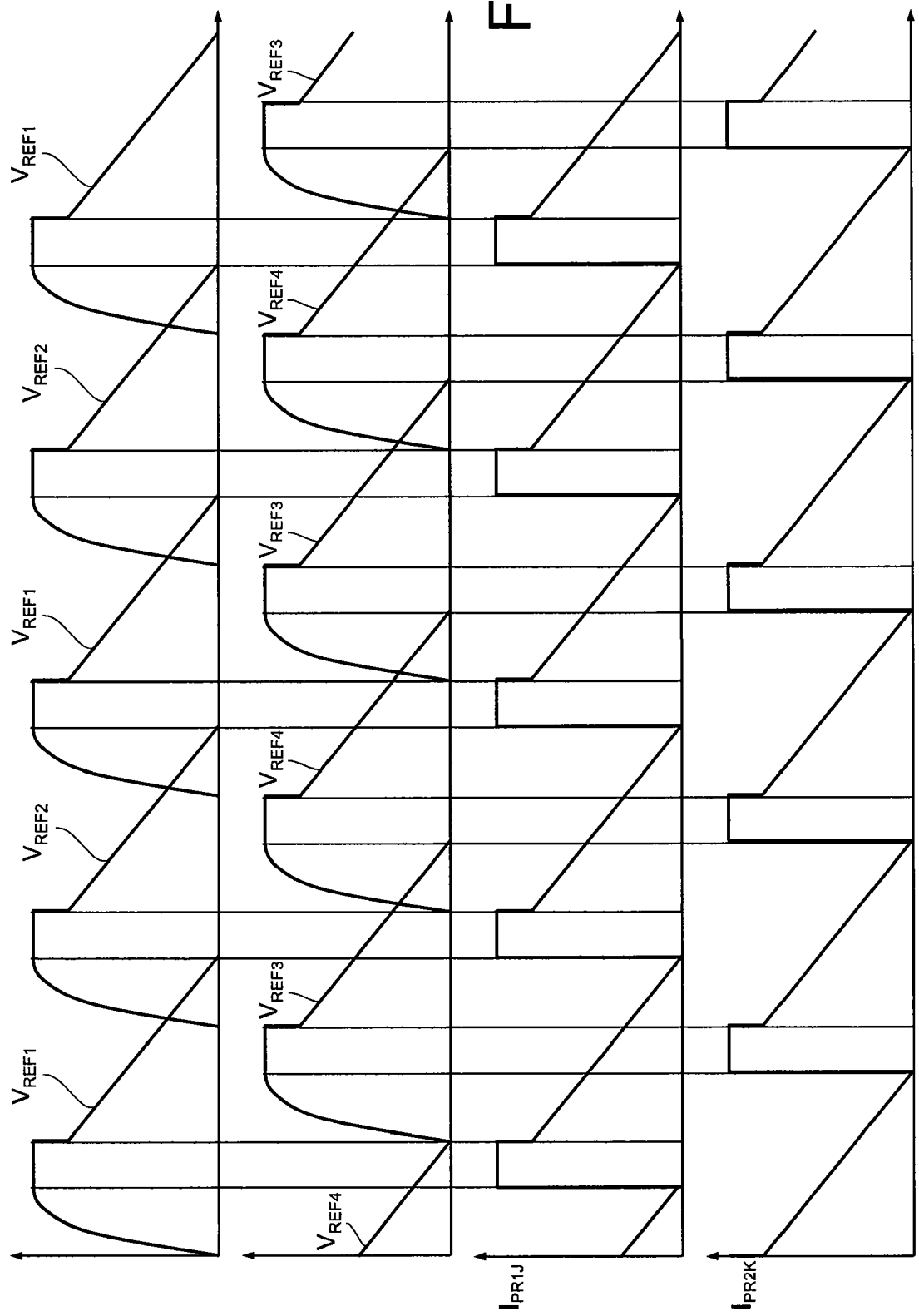
FIG. 14 is a graph that shows quantities corresponding to the programming device of FIG. 13, operated according to a method in accordance with a different embodiment.

Each of the pulse-generator modules 115a, 115b is driven as the circuit 115 of FIG. 10 so as to eliminate the wait times due to charging of the capacitive elements 120 (see also FIG. 14). In addition, the timing signals for the pulse-generator module 115b are delayed by a half-period with respect to the timing signals for the pulse-generator module 115a. In practice, the logic unit 212 drives the second pulse-generator module 115a in the same way, with delay with respect to the first pulse-generator module 115a. Consequently, also the programming current pulses $I_{PR21}$, $I_{PR22}$, ..., $I_{PR2M}$ produced by the pulse-generator module 115b are delayed by a half-period with respect to the programming current pulses $I_{PR11}$, $I_{PR12}$, ..., $I_{PR1M}$ supplied by the pulse-generator module 115a. FIG. 14 shows, by way of example, two generic current pulses, one supplied by the pulse-generator module 115a ($I_{PR1J}$) and one supplied by the pulse-generator module 115b ($I_{PR2K}$).

In this way, it is possible to increase further the parallelism in programming, limiting, however, the maximum current absorbed. During each cycle, in fact, the peak of absorbed current coincides with the reset step and depends upon the number of outputs of the voltage-to-current converters 118 and upon the number of PCM cells 3 effectively selected (i.e., PCM cells 3 not preliminarily excluded on the basis of the comparison between the data already stored therein and the data to be programmed). Thanks to the delayed driving, the peaks of the programming pulses generated by the pulse-generator module 115a ($I_{PR1J}$ in FIG. 14) are not added to the peaks, but to the decreasing ramps of the set step of the programming pulses generated by the pulse-generator module 115b ($I_{PR2K}$ in FIG. 14) and vice versa. The limitation of the maximum current absorbed by the charge pumps is particularly important in low-power devices.

Figure 15:
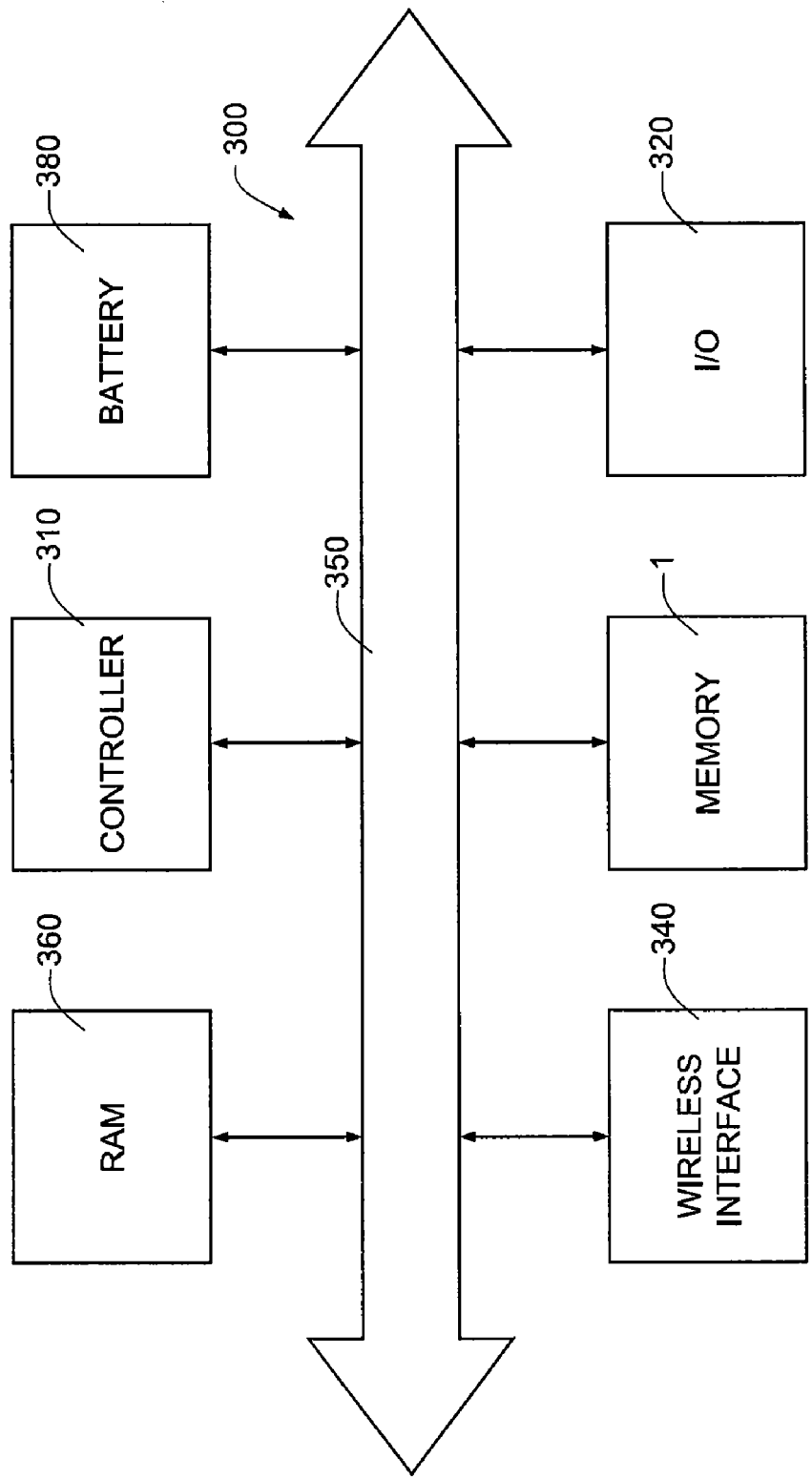
FIG. 15 is a system depiction of an electronic device incorporating the memory of FIG. 1.

Illustrated in FIG. 15 is a portion of a system 300 in accordance with an embodiment. In particular, the system 300 incorporates a phase-change memory, for example, the memory 1 in one of the embodiments described with reference to FIGS. 1-14. For example, the system 300 may be used in devices such as a digital-music player, a digital-film reproducer, a camcorder or a digital photographic camera, a cell phone (especially if provided with image-acquisition functions), a palm-top computer (personal digital assistant, PDA), a laptop computer or portable computer, possibly with wireless-connection capacities, a messaging device, or other devices designed to process, store, transmit, or receive information.

The system 300 may comprise a controller 310, an input/output (I/O) device 320 (for example a keypad or a display), the memory 1, a wireless interface 340 and a working memory 360, of a volatile or nonvolatile type, connected to one another through a bus 350. In one embodiment, a battery 380 may be used for supplying the system 300. It should be noted that the scope of the present invention is not limited to embodiments having necessarily one or all of the devices listed.

The controller 310 may comprise, for example, one or more microprocessors, microcontrollers, and the like.

The I/O device 320 may be used for generating a message. The system 300 may use the wireless interface 340 for transmitting and receiving messages to and from a wireless communication network with a radiofrequency (RF) signal. Examples of wireless interface may comprise an antenna, a wireless transceiver, such as a dipole antenna, even though the scope of the present invention is not limited from this standpoint. In addition, the I/O device 320 may supply a voltage representing what is stored both in the form of digital output and in an analog form.

Finally, it is clear that modifications and variations can be made to the device and to the method described.

Figure 8:
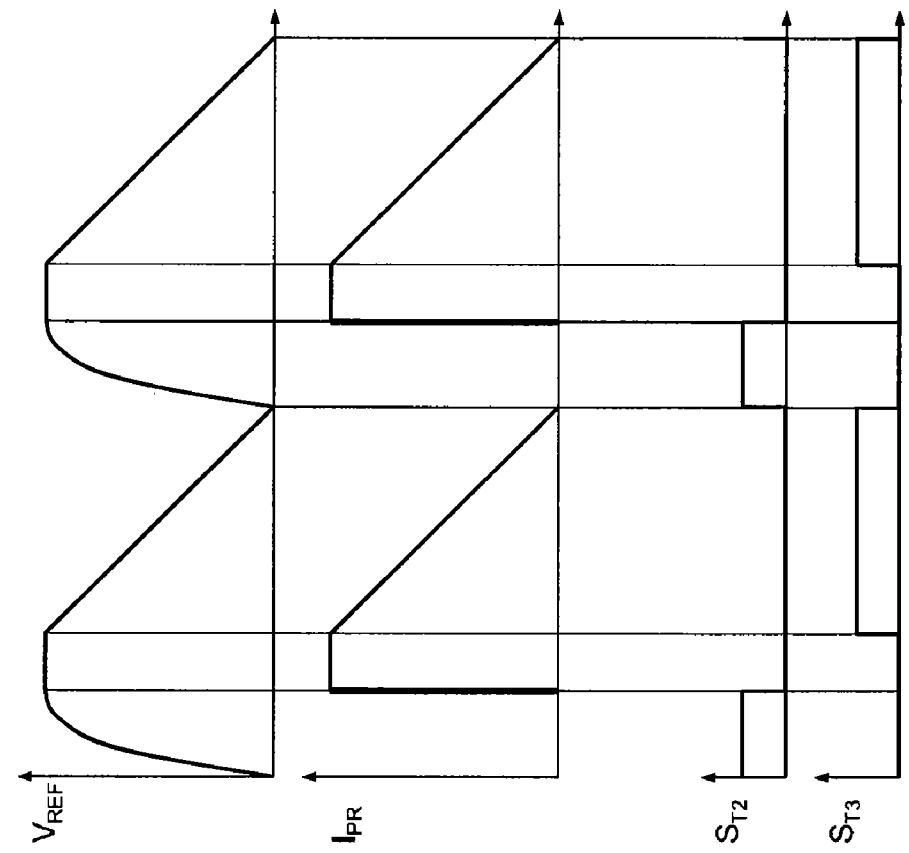
FIG. 8 is a graph that shows quantities corresponding to the programming device of FIG. 9, operated according to a method in accordance with a different embodiment.
Figure 6:
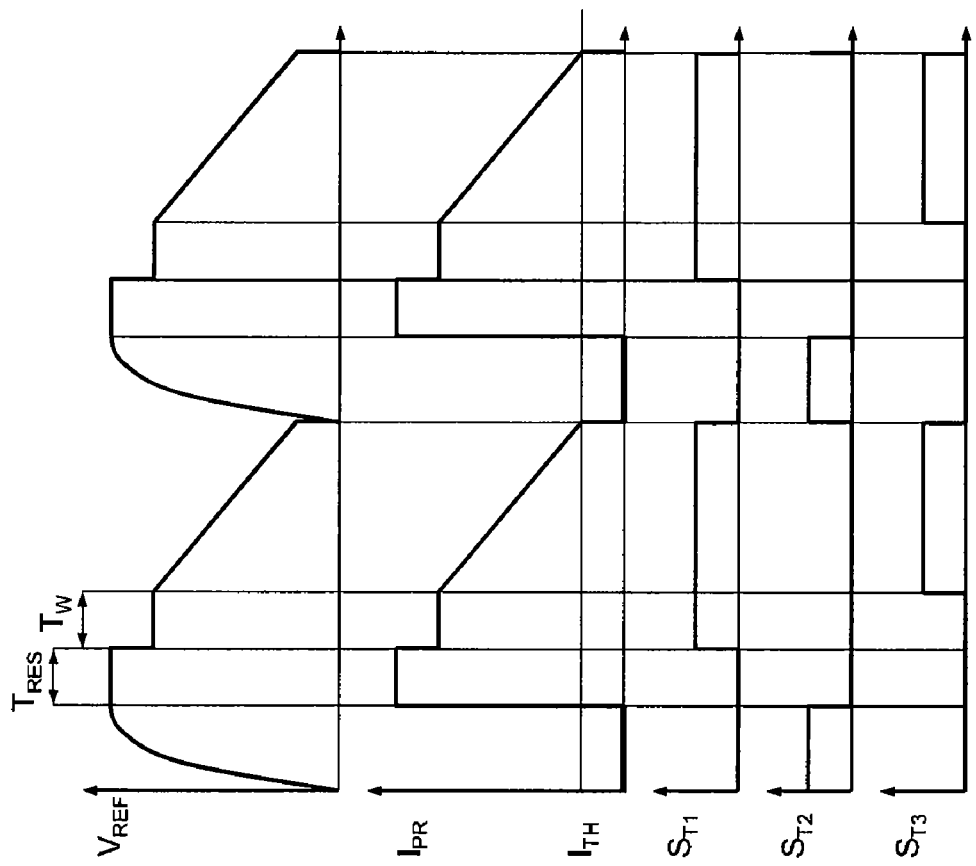
FIG. 6 is a graph that shows quantities corresponding to the programming device of FIG. 2, operated according to a method in accordance with a different embodiment.
Figure 9:
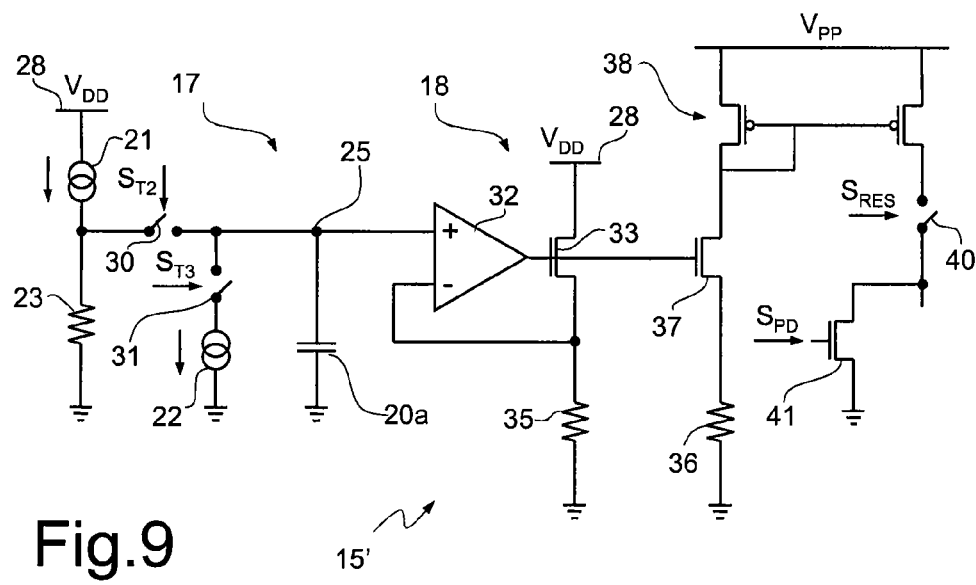
FIG. 9 is a simplified circuit diagram of a device for programming a phase-change memory provided in accordance with a further embodiment.

In particular, also the programming devices illustrated in FIGS. 10 and 13 can be driven for generating programming current pulses of the type illustrated in FIGS. 6 and 8. In addition, programming current pulses can be generated with interruption of the discharge of the capacitive element, but without delay of the discharge with respect to the negative-voltage step.

Also the programming device of FIG. 2 can include a voltage-to-current converter with multiple outputs.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device for programming PCM cells, comprising:
   a pulse-generator circuit for supplying a programming current pulse, the pulse-generator circuit including:
   a first capacitive element;
   a charging circuit selectively coupled to the first capacitive element in a first operating condition, for bringing a reference voltage on the first capacitive element to a reset value;
   a discharge-current generator selectively coupled to the first capacitive element in a second operating condition, for discharging the first capacitive element by a controlled discharge current; and
   a voltage-to-current converter configured to convert the reference voltage into a proportional current; and
   a logic unit configured to control connection and disconnection of the first capacitive element, with the charging circuit and the discharge-current generator, wherein the first capacitive element comprises a first capacitor and a second capacitor, the second capacitor being selectively coupled in parallel to the first capacitor for bringing the reference voltage to an initial set value, lower than the reset value, and the logic unit is configured to connect the second capacitor in parallel to the first capacitor at least in the second operating condition.

2. The device according to claim 1, wherein the voltage-to-current converter includes:
   an operational amplifier having first and second input terminals and an output terminal, the first input terminal being coupled to the first capacitive element;
   a first transistor having a control terminal and first and second conduction terminals, the control terminal being coupled to the output of the operational amplifier, the first conduction terminal being coupled to a first voltage terminal, and the second conduction terminal being coupled to the second input terminal of the operational amplifier;
   a first resistor coupled between the second conduction terminal of the first transistor and a second voltage terminal;
   a second transistor having a control terminal and first and second conduction terminals, the control terminal of the second transistor being coupled to the output of the operational amplifier and the first conduction terminal of the second transistor being configured to supply the proportional current;
   a second resistor coupled between the second conduction terminal of the second transistor and the second voltage terminal.

3. The device according to claim 2, wherein the voltage-to-current converter includes a current mirror having a first current leg coupled in series with the second transistor and a plurality of second current legs for supply respective programming pulses to respective columns of a PCM array.

4. The device according to claim 1, wherein the logic unit is configured to connect the second capacitor in parallel to the first capacitor at least in the second operating condition according to at least one of the following strategies:
   connecting the second capacitor in parallel to the first capacitor and connecting the discharge-current generator to the first capacitive element substantially simultaneously; and
   connecting the second capacitor in parallel to the first capacitor and, after a wait time interval, connecting the discharge-current generator to the first capacitive element.

5. The device according to claim 1, wherein the voltage-to-current converter comprises an operational amplifier and a loop transistor, coupled so as to form a control loop, and wherein the operational amplifier has an input for connection to the first capacitive element.

6. The device according to claim 5, wherein the voltage-to-current converter has a plurality of outputs, connectable to respective PCM cells, and comprises a selection stage, controlled by the logic unit for selectively activating and deactivating the outputs of the voltage-to-current converter.

7. The device according to claim 6, wherein the pulse-generator circuit comprises a storage element configured to store current content of PCM cells selected for programming and data to be stored in the PCM cells selected for programming, and wherein the logic unit is configured to control the selection stage so as to selectively activate and deactivate the outputs of the voltage-to-current converter based on the current content of respective PCM cells and of the corresponding data to be stored.

8. The device according to claim 1, wherein the pulse-generator circuit comprises:
   a second capacitive element, identical to the first capacitive element;
   a first switch element alternately coupling the first capacitive element and the second capacitive element to the charging circuit,
   a second switch element alternately coupling the first capacitive element and the second capacitive element to the discharge-current generator, and
   a third switch element alternately coupling the first capacitive element and the second capacitive element to the voltage-to-current converter.

9. The device according to claim 1, wherein the first capacitive element, the discharge-current generator and the voltage-to-current converter form a first pulse-generator module, and the pulse-generator circuit comprises a second pulse-generator module, identical to the first pulse-generator module and configured to be alternatively connected to the charging circuit, and wherein the logic unit is configured to drive the second pulse-generator module with delay with respect to the first pulse-generator module.

10. An electronic system, comprising:
    a control unit;
    a phase-change memory coupled to the control unit, wherein the phase-change memory comprises an array of PCM cells; and a programming device for programming the PCM cells, the programming device including:
a pulse-generator circuit for supplying a programming current pulse, the pulse-generator circuit including:
a first capacitive element;
a charging circuit selectively coupled to the first capacitive element in a first operating condition, for bringing a reference voltage on the first capacitive element to a reset value;
a discharge-current generator selectively coupled to the first capacitive element in a second operating condition, for discharging the first capacitive element by a controlled discharge current; and
a voltage-to-current converter configured to convert the reference voltage into the programming current pulse; and
a logic unit configured to control connection and disconnection of the first capacitive element, with the charging circuit and the discharge-current generator, wherein the first capacitive element comprises a first capacitor and a second capacitor, the second capacitor being selectively coupled in parallel to the first capacitor for bringing the reference voltage to an initial set value, lower than the reset value, and the logic unit is configured to connect the second capacitor in parallel to the first capacitor at least in the second operating condition.

11. The system according to claim 10, wherein the logic unit is configured to connect the second capacitor in parallel to the first capacitor at least in the second operating condition according to at least one of the following strategies:
connecting the second capacitor in parallel to the first capacitor and connecting the discharge-current generator to the first capacitive element substantially simultaneously; and
connecting the second capacitor in parallel to the first capacitor and, after a wait time interval, connecting the discharge-current generator to the first capacitive element.

12. The system according to claim 10, wherein the voltage-to-current converter comprises:
an operational amplifier having first and second input terminals and an output terminal, the first input terminal being coupled to the first capacitive element;
a first transistor having a control terminal and first and second conduction terminals, the control terminal being coupled to the output of the operational amplifier, the first conduction terminal being coupled to a first voltage terminal, and the second conduction terminal being coupled to the second input terminal of the operational amplifier;
a first resistor coupled between the second conduction terminal of the first transistor and a second voltage terminal;
a second transistor having a control terminal and first and second conduction terminals, the control terminal of the second transistor being coupled to the output of the operational amplifier and the first conduction terminal of the second transistor being configured to supply the proportional current;
a second resistor coupled between the second conduction terminal of the second transistor and the second voltage terminal.

13. The system according to claim 12, wherein the voltage-to-current converter has a plurality of outputs, connectable to respective PCM cells, and comprises a selection stage, controlled by the logic unit for selectively activating and deactivating the outputs of the voltage-to-current converter.

14. The system according to claim 13, wherein the voltage-to-current converter includes a current mirror having a first current leg coupled in series with the second transistor and a plurality of second current legs that respectively include the plurality of outputs of the voltage-to-current converter, wherein the selection stage is configured to selectively couple the second current legs to respective columns of the array of PCM cells.

15. The system according to claim 13, wherein the pulse-generator circuit comprises a storage element configured to store current content of PCM cells selected for programming and data to be stored in the PCM cells selected for programming, and wherein the logic unit is configured to control the selection stage so as to selectively activate and deactivate the outputs of the voltage-to-current converter based on the current content of respective PCM cells and of the corresponding data to be stored.

16. The system according to claim 10, wherein the pulse-generator circuit comprises:
a second capacitive element, identical to the first capacitive element;
a first switch element alternately coupling the first capacitive element and the second capacitive element to the charging circuit;
a second switch element alternately coupling the first capacitive element and the second capacitive element alternatively connectable to the discharge-current generator; and
a third switch element alternately coupling the first capacitive element and the second capacitive element to the voltage-to-current converter.

17. The system according to claim 10, wherein the first capacitive element, the discharge-current generator and the voltage-to-current converter form a first pulse-generator module, and the pulse-generator circuit comprises a second pulse-generator module, identical to the first pulse-generator module and configured to be alternatively connected to the charging circuit, and wherein the logic unit is configured to drive the second pulse-generator module with delay with respect to the first pulse-generator module.

18. A method for programming PCM cells, comprising:
selecting a PCM cell for programming;
generating programming current pulses; and
supplying the programming current pulses to the PCM cell selected, the generating programming current pulses including:
charging a first capacitive element so as to bring a reference voltage on the first capacitive element (to a reset value, wherein the charging comprises charging a first capacitor;
converting the reference voltage on the first capacitive element into current;
stepwise reducing the reference voltage by switching a second capacitor into a parallel configuration with the first capacitor; and;
discharging the first capacitive element by a controlled discharge current.

19. A method according to claim 18, wherein generating programming current pulses comprises maintaining the reference voltage at the reset value for a reset time interval and, after the reset time interval, stepwise reducing the reference voltage down to an initial set value, lower than the reset value.

20. The method according to claim 18, wherein the converting includes using a voltage-to-current converter that includes:

an operational amplifier having first and second input terminals and an output terminal, the first input terminal being coupled to the first capacitive element;
a first transistor having a control terminal and first and second conduction terminals, the control terminal being coupled to the output of the operational amplifier, the first conduction terminal being coupled to a first voltage terminal, and the second conduction terminal being coupled to the second input terminal of the operational amplifier;
a first resistor coupled between the second conduction terminal and a second voltage terminal;
a second transistor having a control terminal and first and second conduction terminals, the control terminal of the second transistor being coupled to the output of the operational amplifier and the first conduction terminal of the second transistor being configured to supply the proportional current;
a first resistor coupled between the second conduction terminal of the second transistor and the second voltage terminal.

21. The method according to claim 18, wherein switching the second capacitor into the parallel configuration with the first capacitor is substantially simultaneous to discharging the first capacitive element.

22. The method according to claim 18, wherein discharging the first capacitive element starts after a wait time interval from stepwise reducing the reference voltage.

23. The method according to claim 18, wherein generating programming current pulses comprises interrupting discharging the first capacitive element when a programming current flowing through the selected PCM cell reaches a threshold.

24. The method according to claim 18, wherein generating programming current pulses comprises:
during discharging the first capacitive element, charging a second capacitive element so as to bring a reference voltage on the second capacitive element to the reset value;
during charging the first capacitive element, discharging the second capacitive element by the discharge current; and
converting the reference voltage on the second capacitive element into current.

25. The method according to claim 24, comprising selecting a further PCM cell for programming;
generating further programming current pulses; and
supplying the further programming current pulses to the further PCM cell selected;
wherein generating further programming current pulses comprises:
charging a third capacitive element so as to bring a reference voltage on the third capacitive element to the reset value;
discharging the third capacitive element by a further controlled discharge current;
converting the reference voltage on the third capacitive element into current;
during discharging of the third capacitive element, charging a fourth capacitive element so as to bring a reference voltage on the fourth capacitive element to the reset value;
during charging the third capacitive element, discharging the fourth capacitive element by the discharge current; and
converting the reference voltage on the fourth capacitive element into current;
and wherein converting the reference voltage on the third capacitive element into current is delayed with respect to converting the reference voltage on the first capacitive element, and converting the reference voltage on the fourth capacitive element into current is delayed with respect to converting the reference voltage on the second capacitive element into current.

26. A device for programming PCM cells, comprising:
a pulse-generator circuit for supplying a programming current pulse, the pulse-generator circuit including:
a first capacitive element;
a charging circuit selectively coupled to the first capacitive element in a first operating condition, for bringing a reference voltage on the first capacitive element to a reset value;
a discharge-current generator selectively coupled to the first capacitive element in a second operating condition, for discharging the first capacitive element by a controlled discharge current; and
a voltage-to-current converter configured to convert the reference voltage into a proportional current, the voltage-to-current converter including:
an operational amplifier having first and second input terminals and an output terminal, the first input terminal being coupled to the first capacitive element;
a first transistor having a control terminal and first and second conduction terminals, the control terminal being coupled to the output of the operational amplifier, the first conduction terminal being coupled to a first voltage terminal, and the second conduction terminal being coupled to the second input terminal of the operational amplifier;
a first resistor coupled between the second conduction terminal of the first transistor and a second voltage terminal;
a second transistor having a control terminal and first and second conduction terminals, the control terminal of the second transistor being coupled to the output of the operational amplifier and the first conduction terminal of the second transistor being configured to supply the proportional current;
a second resistor coupled between the second conduction terminal of the second transistor and the second voltage terminal; and
a logic unit configured to control connection and disconnection of the first capacitive element, with the charging circuit and the discharge-current generator.

27. The device according to claim 26, wherein the voltage-to-current converter comprises:
a plurality of outputs for connection to respective PCM cells;
a selection stage, controlled by the logic unit for selectively activating and deactivating the outputs of the voltage-to-current converter;
a current mirror having a first current leg coupled in series with the second transistor and a plurality of second current legs that respectively include the plurality of outputs of the voltage-to-current converter.

28. The device according to claim 27, wherein the pulse-generator circuit comprises a storage element configured to store current content of PCM cells selected for programming and data to be stored in the PCM cells selected for programming, and wherein the logic unit is configured to control the selection stage so as to selectively activate and deactivate the outputs of the voltage-to-current converter based on the current content of respective PCM cells and of the corresponding data to be stored.

29. The device according to claim 26, wherein the pulse-generator circuit comprises:
a second capacitive element, identical to the first capacitive element;
a first switch element alternately coupling the first capacitive element and the second capacitive element to the charging circuit,
a second switch element alternately coupling the first capacitive element and the second capacitive element to the discharge-current generator, and
a third switch element alternately coupling the first capacitive element and the second capacitive element to the voltage-to-current converter.

\* \* \* \* \*